(12) United States Patent
Dalal et al.

(10) Patent No.: US 12,166,147 B2
(45) Date of Patent: Dec. 10, 2024

(54) THIN-FILM CRYSTALLINE SILICON SOLAR CELL USING A NANOIMPRINTED PHOTONIC-PLASMONIC BACK-REFLECTOR STRUCTURE

(71) Applicants: Vikram Dalal, Ames, IA (US); David Keogh, San Diego, CA (US)

(72) Inventors: Vikram Dalal, Ames, IA (US); David Keogh, San Diego, CA (US)

(73) Assignees: Pacific Integrated Energy, Inc., San Diego, CA (US); Iowa State University Research Foundation, Inc., Ames, IA (US)

( * ) Notice: Subject to any disclaimer, the term of this patent is extended or adjusted under 35 U.S.C. 154(b) by 13 days.

(21) Appl. No.: 17/834,242

(22) Filed: Jun. 7, 2022

(65) Prior Publication Data

US 2022/0310870 A1    Sep. 29, 2022

Related U.S. Application Data

(63) Continuation of application No. PCT/US2020/063953, filed on Dec. 9, 2020.
(Continued)

(51) Int. Cl.
*H01L 31/18* (2006.01)
*H01L 31/0232* (2014.01)
(Continued)

(52) U.S. Cl.
CPC .... *H01L 31/1804* (2013.01); *H01L 31/02327* (2013.01); *H01L 31/0747* (2013.01); *H01L 31/1864* (2013.01); *H01L 31/202* (2013.01)

(58) Field of Classification Search
CPC ........... H01L 31/1804; H01L 31/02327; H01L 31/0747; H01L 31/1864; H01L 31/202;
(Continued)

(56) References Cited

U.S. PATENT DOCUMENTS

| | | | |
|---|---|---|---|
| 4,637,869 A | * | 1/1987 | Glocker ............ H01L 21/02631 136/258 |
| 2006/0264004 A1 | * | 11/2006 | Tong ................. H01L 21/76254 438/455 |

(Continued)

FOREIGN PATENT DOCUMENTS

| | | | |
|---|---|---|---|
| EP | 2549547 A1 | | 1/2013 |
| JP | 2004327578 A | * | 11/2004 |
| KR | 20110008541 A | | 1/2011 |

OTHER PUBLICATIONS

E.A. Al-Nuaimy et al.; Excimer Laser Crystallization and Doping Of Source and Drain Regions in High Quality Amorphous Silicon Thin Film Transistors; https://doi.org/10.1063/1.117128. Jun. 4, 1998, 4 pages.
(Continued)

*Primary Examiner* — Michael Y Sun
(74) *Attorney, Agent, or Firm* — Reinhart Boerner Van Deuren P.C.

(57) ABSTRACT

Disclosed are embodiments of a thin-film photovoltaic technology including a single-junction crystalline silicon solar cell with a photonic-plasmonic back-reflector structure for lightweight, flexible energy conversion applications. The back-reflector enables high absorption for long-wavelength and near-infrared photons via diffraction and light-concentration, implemented by periodic texturing of the bottom-contact layer by nanoimprint lithography. The thin-film crystalline silicon solar cell is implemented in a heterojunction design with amorphous silicon, where plasma enhanced chemical vapor deposition (PECVD) is used for all device layers, including a low-temperature crystalline silicon deposition step. Excimer laser crystallization is used to integrate crystalline and amorphous silicon within a monolithic process, where a thin layer of amorphous silicon is converted to a crystalline silicon seed layer prior to deposition of a
(Continued)

crystalline silicon absorber layer via PECVD. The crystalline nature of the absorber layer and the back-reflector enable efficiencies higher than what is achievable in other thin-film silicon devices.

21 Claims, 5 Drawing Sheets

Related U.S. Application Data

(60) Provisional application No. 62/945,699, filed on Dec. 9, 2019.

(51) Int. Cl.
*H01L 31/0747* (2012.01)
*H01L 31/20* (2006.01)

(58) Field of Classification Search
CPC ......... H01L 31/022425; H01L 31/0725; H01L 31/1872; H01L 31/056; H01L 31/0392; Y02E 10/52; Y02P 70/50
See application file for complete search history.

(56) References Cited

U.S. PATENT DOCUMENTS

| | | | | |
|---|---|---|---|---|
| 2009/0020154 | A1* | 1/2009 | Sheng | H01L 31/03685 438/96 |
| 2009/0308453 | A1* | 12/2009 | Roca I Cabarrocas | H01L 31/0745 136/258 |
| 2010/0282314 | A1* | 11/2010 | Coakley | H01L 31/02363 136/258 |
| 2012/0125430 | A1 | 5/2012 | Ding et al. | |
| 2012/0211069 | A1* | 8/2012 | Yun | H01L 31/076 257/E31.047 |
| 2014/0065804 | A1* | 3/2014 | Tian | H01L 21/0245 438/487 |
| 2015/0101662 | A1* | 4/2015 | Seutter | H01L 31/02167 136/256 |
| 2015/0280043 | A1* | 10/2015 | Smith | H01L 31/1804 136/258 |

OTHER PUBLICATIONS

J. Dore et al.; Performance potential of low-defect density silicon thin-film solar cells obtained by electron beam evaporation and laser crystallization, www.epj-pv.org, Jan. 11, 2013, 5 pages.

G. Andra et al., A New Technology For Crystalline Silicon Thin Film Solar Cells On Glass Based On Laser Crystallization; known to applicant on or before Dec. 9, 2020; 4 pages.

Christophe Ballif et al., Amorphous Silicon/Crystalline Silicon Heterojunction Solar Cells, http://dx.doi.org/10.1016/8978-0-12-388417-6.0003-9, 2014, 48 pages.

Stefaan De Wolf et al.; High-efficiency Silicon Heterojunction Solar Cells: A Review, www.searchgate.net/publication/239735318, Jan. 2012, 19 pages.

Taguchi et al.; IEEE Journal of Photovoltaics, vol. 4, No. 1; 24.7% Record Efficiency HIT Solar Cell on Thin Silicon Wafer; Jan. 2014, 4 pages.

Joydeep Bhattacharya et al.; A Photonic-Plasmonic Structure for Enhancing Light Absorption in Thin Film Solar Cells; https://doi.org/10.10631/1.3641469, Sep. 30, 2011, 4 pages.

Hung-Ling Chen et al.; A 19.9%-efficient ultrathin solar cell based on a 205-nm-thick GaAs absorber and a silver nanostructured back mirror; www.nature.com/natureenergy, Aug. 5, 2019; 7 pages.

Corning Incorporated; Corning Willow Glass Fact Sheet; Aug. 2019; 2 pages.

* cited by examiner

THIN-FILM CRYSTALLINE SILICON SOLAR CELL USING A NANOIMPRINTED PHOTONIC-PLASMONIC BACK-REFLECTOR STRUCTURE

CROSS-REFERENCE TO RELATED PATENT APPLICATIONS

This patent application is a continuation of PCT/US2020/063953, filed Dec. 9, 2020, which claims the benefit of U.S. Provisional Patent Application No. 62/945,699, filed Dec. 9, 2019, the entire teachings and disclosure of which are incorporated herein by reference thereto.

FIELD OF THE INVENTION

This invention relates in general to semiconductor devices, and more specifically to solar cell devices that utilize a thin-film of crystalline silicon in conjunction with a periodic back-reflector structure to achieve high efficiency.

BACKGROUND OF THE INVENTION

While crystalline silicon photovoltaics (PV) dominate the residential, commercial, and utility-scale markets as a result of its combination of high efficiency, excellent reliability, and expected lifetime of up to 40 years, there exists a number of markets that remain closed off to this technology. For instance, applications that require lightweight or flexible solar cells, such as portable power, space & satellite systems, as well as building integrated PV (BIPV), must rely on one of a number of thin-film technologies, since silicon is inherently heavy and rigid because of its use of thick crystalline silicon substrates. Flexible and light-weight thin-film PV is a compelling technology also because it reduces installation costs and allows for new installation targets, especially in developing and underserved global markets. To date, however, none of the available thin-film technologies, including GaAs, CdTe, CIGS, and amorphous silicon (aSi:H), offer a competitive combination of cost, efficiency, flexibility, and safety to meet the needs of these niche but growing markets. As an example, the BIPV market is expected to grow >18% year-over-year, reaching >$35B in annual sales by 2025, with limited thin-film efficiency cited as one of the main obstacles to faster adoption.

GaAs based PV technology currently sets the standard for performance, with one-sun cell-level efficiencies as high as 29% for a single-junction, which is very close to the Schockley-Quiesser limit. Despite the excellent performance, the technology remains extremely expensive owing to the use of expensive substrates for epitaxial growth of the device layers, resulting in a cost that is >10× compared with silicon PV. Dual-junction and triple-junction technologies are able to push the efficiency even higher and also reduce the cell size through the use of high concentration (>100×), but the cost still remains extremely high. Achieving these high efficiency values, however, requires the use of a thick, rigid substrate which precludes the technology from flexible form factors. Though considerable work has been performed to develop flexible GaAs PV technology, the performance degradation is considerable and the production costs still high. At this time, GaAs remains a niche technology used primarily in space/satellite applications where cost is considerably less important.

On the other hand, CdTe and CIGS are two commercially available thin-film technologies with projected costs that can theoretically compete with crystalline silicon, yet are produced using roll-to-roll processes that yield flexible form-factors. Cell-level efficiencies of >20% have been demonstrated, with flexible form factors exhibiting lower efficiencies on the order of 14-17%. On the surface, these two technologies appear quite exciting, and as a result have received much attention recently. At the same time, each of these technologies have potential limitations that may prevent widespread adoption. In the case of CdTe, one of the largest concerns is the issues of cadmium (Cd) toxicity, with many EU countries considering a ban on the use of cadmium in commercial products, though an exception for solar panels is being considered. Furthermore, there is debate over the potential scarcity of tellurium (Te), which is one of the nine rarest elements in the earth's crust, potentially limiting the ultimate scale of the technology. CIGS (copper indium gallium selenide) technology faces a similar scarcity issue with indium, but also a materials cost issue, with indium and gallium market prices typically exceeding $400 per kilogram.

Once a quite promising thin-film PV technology, thin-film aSi:H has not fulfilled its potential as a result of limitations imposed by the defects and recombination losses associated with the amorphous nature of the material. Furthermore, the large-scale manufacturability has proven difficult as a result of the slow deposition rates required for the intrinsic aSi:H absorber layer. Along the way, the technological and manufacturing improvements of competing thin-film technologies such as CdTe and CIGS have significantly outpaced that of aSi:H. The combination of massive abundance and non-toxicity of silicon, the extensive supply-chain and infrastructure for materials and equipment, along with the potential for large-scale manufacturing, low-cost, and flexible form factors, make thin-film silicon a nearly ideal PV technology. New approaches that enable high efficiency and high-throughput manufacturing are needed to enable a viable, cost-competitive thin-film silicon based PV technology.

Therefore, there is a general need in the art for improved thin-film crystalline silicon solar cell materials and devices, based on their potential for high efficiency and low cost using high-throughput roll-to-roll processing methods and equipment.

SUMMARY OF THE INVENTION

Embodiments of the present disclosure describe a thin-film solar cell that uses a crystalline silicon absorber in a heterojunction design with amorphous silicon. The thin-film solar cell is capable of high-efficiency through integration with a back-reflector having a periodic structure that enhances light absorption using photonic and plasmonic effects. Furthermore, the crystalline and amorphous materials can be deposited monolithically using a single deposition method (e.g., plasma enhanced chemical vapor deposition (PECVD)). A laser annealing step produces a crystalline silicon layer on the layer of amorphous silicon. The crystalline silicon layer serves as the seed layer for subsequent crystalline silicon deposition.

Embodiments of the present disclosure address many of the above-mentioned limitations of traditional crystalline silicon and emerging thin-film PV technologies. For example, traditional crystalline silicon solar cells use thick wafers that are typically in excess of 100 μm, and therefore are not capable of flexible form-factors. In addition, the use of silicon eliminates the issue of toxicity (e.g., Cd in CdTe) and materials scarcity (e.g., Te in CdTe and In in CIGS), as silicon is the second most abundant element in the Earth's crust and inherently non-toxic.

According to the present disclosure, the integration of three individual technologies working together provides a high efficiency solar cell device using crystalline silicon as the absorber layer for flexible, light-weight PV applications. The three individual technologies are: 1) a monolithic crystalline/amorphous silicon heterojunction solar cell using crystalline silicon as the absorber layer, 2) a photonic-plasmonic back-reflector structure, and 3) a laser crystallization processing step. Using these three technologies, a high efficiency thin-film solar cell device can be produced.

The use of a monolithic crystalline/amorphous silicon heterojunction solar cell design serves multiple purposes. The first is that crystalline silicon provides high energy conversion efficiency as a result of lower defect density and recombination losses. Amorphous silicon has long been touted as a promising thin-film material, but the high density of defects inherent to disordered materials has limited the efficiency to <12%, even for dual-junction or triple-junction devices. In addition, introduction of amorphous silicon layers to form heterojunctions with the crystalline silicon absorber prevents recombination losses in the quasi-neutral region of the device, as well as at the contact layers. Having n-type and p-type amorphous silicon layers provides a barrier to the carriers, and thus provides for higher efficiency. This heterojunction structure has emerged recently for commercially available high-efficiency mono-crystalline silicon solar panels available from a number of manufacturers; most notably Panasonic/Sanyo with their HIT panels (Heterojunction with Intrinsic Thin layer).

In contrast to such commercially available mono-crystalline silicon HIT PV, the presently disclosed thin-film PV are distinguishable in two significant ways. The first is the process by which the technology is manufactured. Mono-crystalline silicon HIT PV begin with a thick polished silicon wafer, with amorphous silicon deposited on either side to form the heterojunctions. According to the present disclosure, however, both the amorphous and crystalline silicon materials will be deposited in a monolithic process, such as PECVD, preferably in a roll-to-roll processes on flexible substrates. In this way, it is possible to utilize the high-throughput manufacturing infrastructure currently in place for amorphous silicon PV, lowering the cost of production. The second is that the HIT PV panels, such as those made by Panasonic, use silicon wafers with absorber thicknesses of ~100 µm, whereas the presently disclosed thin-film PV has absorber thicknesses on the order of 1-20 µm. Because of the indirect bandgap for silicon, absorber thicknesses of >100 µm are required to capture virtually all of the incident light above bandgap light. To capture this light at an absorber thickness of 1-20 µm, a second technology is necessary as described in the next section.

The second technology component is a periodic back-reflector structure that takes advantage of both photonic and plasmonic effects to enhance light trapping (and thus absorption) within the thin film of crystalline silicon absorber. In this photonic-plasmonic back-reflector structure, the photonic effect is produced by the periodic nature of the patterned reflector, which uses dimensions smaller than the wavelength of light to effectively diffract the incoming light into multiple closely spaced guided mode resonances (i.e., total internal reflection). Furthermore, the light is also concentrated using a plasmonic metal coating as part of the periodic structure, which uses surface plasmons to significantly increase the intensity of the fields within the device. In some embodiments, the photonic-plasmonic back-reflector includes a transparent conductive oxide (TCO) layer, such as aluminum-doped zinc oxide, to create a tunnel diode structure between the back-reflector metal and the amorphous silicon. In particular, the photonic-plasmonic structure targets improvement for the longer wavelengths of incident light, typically >700 nm, as near-bandgap photons typically have a low absorption coefficient and are not efficiently absorbed. Modeling of a crystalline silicon solar cell having a photonic-plasmonic back-reflector suggests an efficiency in the range of 17-20% for an absorber layer with thickness of 1-20 µm.

While the combination of the crystalline silicon based solar cell and the photonic-plasmonic back-reflector has the potential to produce a high efficiency PV technology in a flexible thin-film form factor, the technology can be further improved in terms of cost by adopting an appropriate high-throughput manufacturing process. A low-cost manufacturing process is provided by laser crystallization that allows for the low temperature monolithic integration of crystalline silicon and amorphous silicon materials. In this process, crystalline silicon and amorphous silicon can both be deposited using the same deposition equipment, such as plasma enhanced chemical vapor deposition (PECVD). Because crystalline materials cannot be deposited directly on top of amorphous silicon materials, however, as they typically mimic the surface layers and assume an amorphous structure, a thin-layer of the amorphous silicon is first crystallized prior to deposition of the crystalline layer. One method to crystallize the thin-layer of amorphous silicon is excimer laser annealing (ELA). Here, a thin-layer of amorphous silicon is irradiated with short pulses of high-energy ultraviolet light, which initially melts the silicon and then results in crystallization upon solidification. The crystalline material can then serve as a high-quality seed-layer or template for subsequent deposition of crystalline silicon.

At the same time, however, crystallization of amorphous silicon materials may also be achieved using continuous-wave (CW) or pulsed light sources across a diverse portion of the electromagnetic spectrum. For example, wavelengths spanning from ultraviolet (193 nm) to near-infrared (940 nm) and longer can be used to crystallize amorphous silicon. In addition, the use of an electron beam with energies on the order of keV has been used to induce crystallinity from amorphous silicon layers. The optimum mode (CW or pulsed) and wavelength chosen will depend on the exact structure on the solar cell as well as on the process and equipment needed to produce a solar cell in a cost competitive manner.

Other aspects, objectives and advantages of the invention will become more apparent from the following detailed description when taken in conjunction with the accompanying drawings.

BRIEF DESCRIPTIONS OF THE DRAWINGS

The accompanying drawings incorporated in and forming a part of the specification illustrate several aspects of the present invention and, together with the description, serve to explain the principles of the invention. In the drawings.

Figure 4:
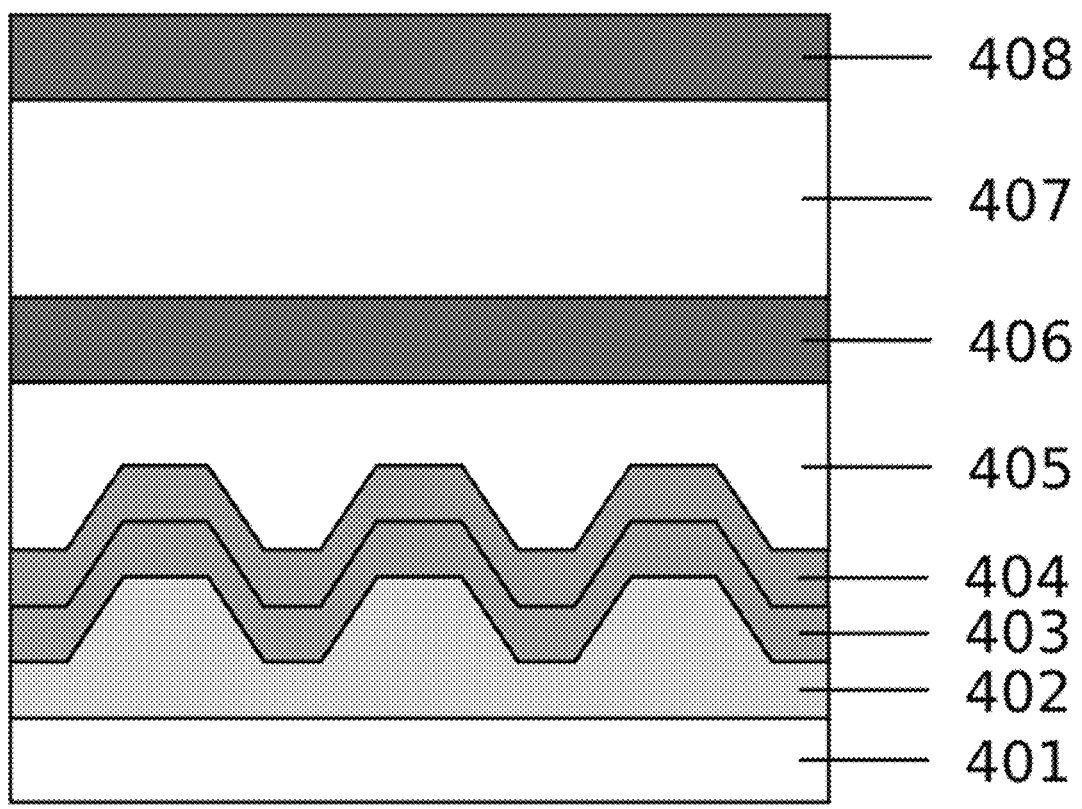
Figure 5:
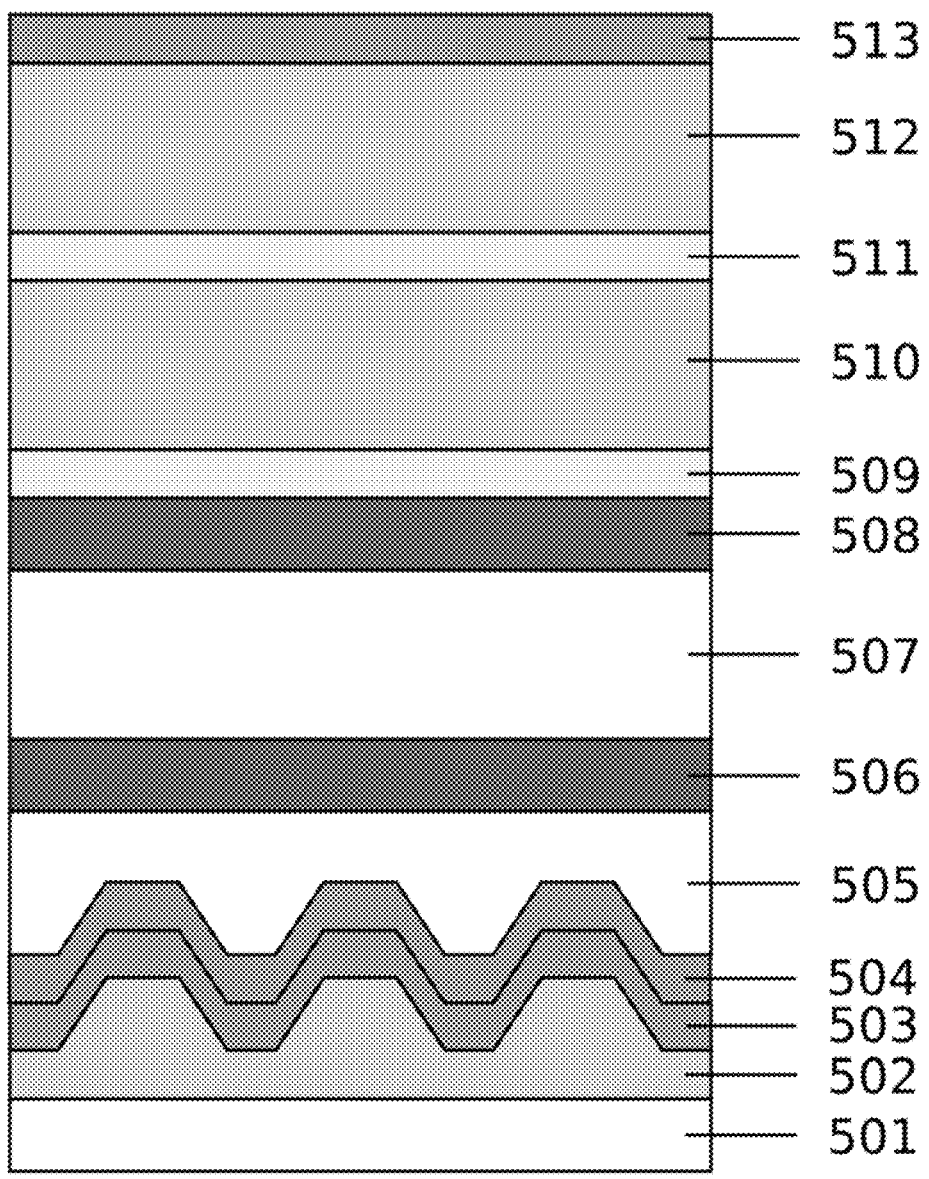

FIG. 4 shows the layer structure of the solar cell incorporating the photonic-plasmonic back-reflector, the laser crystallized seed-layer, and the thin-film silicon heterojunction design, according to an exemplary embodiment; and FIG. 5 shows the layer structure of the solar cell incorporating the photonic-plasmonic back-reflector, the laser crystallized seed-layer, and the thin-film silicon heterojunction, incorporated into a multiple junction solar cell design (in this case a triple-junction solar cell), according to an exemplary embodiment.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Excimer Laser Annealing

Excimer laser annealing (ELA) is a mature technology that has been actively researched for 30+ years and has found commercial success primarily in the manufacturing of thin-film transistors (TFTs) for various display applications, such as LCDs and smartphones. This process allows for low-temperature processing of high-quality silicon materials on large-area glass panels, without melting or degradation of the glass itself. High temperatures (>500° C.) are typically required to achieve silicon materials with the high mobilities necessary for high-speed TFTs. Prior technology generations used amorphous silicon based TFTs, as a result of their low temperature processability (250° C.), but as display technologies matured and required higher performance, the low mobility associated with amorphous silicon TFTs became a limiting factor. Crystalline materials offer much higher mobilities and performance, but also require much high processing temperatures.

Figure 1:
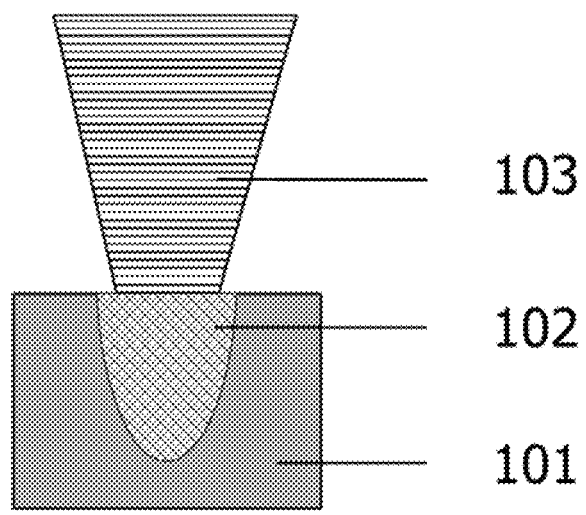
FIG. 1 shows the laser crystallization process of amorphous silicon, according to an exemplary embodiment.

As disclosed herein, excimer laser annealing allows embodiments of the present invention to achieve the best of what amorphous and crystalline silicon material has to offer: high mobilities with low processing temperatures. As shown in FIG. 1, the process entails first depositing amorphous silicon (101) using low temperature PECVD deposition with deposition temperatures in the range of 300° C.-550° C., followed by its conversion to crystalline silicon (102) using irradiation with a focused light beam from a high energy laser source (103). By using very short but intense laser pulses, the energy/heat can be localized to a thin layer at the surface of the amorphous silicon, which induces melting of the material. Upon cooling, the material solidifies with a crystalline structure as opposed to the original amorphous structure. Though the material is crystalline, it is not perfectly ordered as in a single crystal material, but rather contains a number of grains of differing orientation, referred to as poly-crystalline. Despite the imperfect poly-crystalline nature of the material, the mobility of the electrons can be enhanced up to 100× or more compared with amorphous silicon.

Though the concept of crystallization of amorphous silicon is introduced in relation to excimer lasers, other light sources may be used as well. Notwithstanding, one advantage of excimer lasers is the capability of high pulse energies (>100 milli-Joules) within narrow pulse widths (<50 nanoseconds) that induce melting without excessively elevating the substrate temperature. Other technologies that can achieve similar results include flash lamps and diode lasers emitting in the blue and green portion of the electromagnetic spectrum. Virtually any wavelength with energy greater than the bandgap of amorphous silicon can be used in principle, provided enough energy is delivered to melt the amorphous silicon. As mentioned previously, electromagnetic sources with energies ranging from the near-infrared (~1 eV) out to electron beam energies of >1 keV can be used to crystallize amorphous silicon. Ultimately, the goal is to generate a layer of crystalline silicon with large grains sizes, ideally 10 μm or larger. In general, the larger the grain sizes, the higher the maximum efficiency for the solar cell device, and the large grain sizes can be produced by manipulating a number of experimental parameters, such as: laser wavelength, pulse width, laser repetition rate, total laser dose, substrate temperature, substrate material, as well as the exact materials and thicknesses used for the solar cell device.

One additional aspect of particular importance for this invention is the hydrogen content of the as-deposited amorphous silicon layer. Typically, a relatively high concentration of hydrogen is introduced into the amorphous silicon to improve the crystal quality and enhance the conductivity of the p-type or n-type materials. For laser annealing according to the present disclosure, however, the hydrogen concentration is reduced, as the hydrogen can easily leave the crystal lattice and cause the device layers to delaminate from the substrate. In embodiments, the hydrogen content of the amorphous silicon is less than 5%, and in particular less than 3%, which is considerably lower than the doped amorphous silicon used in solar cells that typically has >10% hydrogen content.

Photonic-Plasmonic Back Reflector

The back reflector takes advantage of both photonic and plasmonic phenomena to enhance the light absorption of thin-film layers of crystalline silicon. One of the major limitations of thin-film solar cells is the long absorption lengths for the longer wavelength photons incident on the device. While the thickness of the absorber layer is ideally on the order of 2 μm or less, the absorption length is on the order of 2-100 μm for wavelengths >650 nm. To maximize absorption, the light must therefore be reflected a number of times using specialized back-reflector structures. A typical back-reflector structure consists of a silver contact layer coated with a thin layer of ZnO, but a significant portion of the light incident upon this reflector is absorbed with each reflection, on the order of 3-8%. The improvement in light absorption is therefore quite modest, leaving a significant amount of light lost to parasitic absorption.

Figure 2:
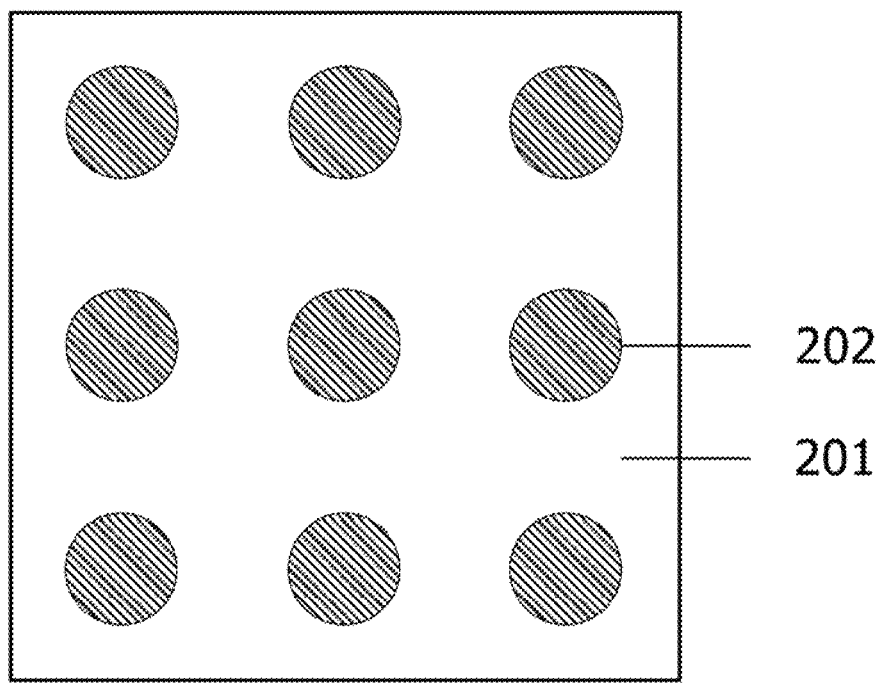
FIG. 2 shows the top-view of the photonic-plasmonic back-reflector structure, according to an exemplary embodiment.

To further enhance light absorption, photonic crystals can be used. In this approach (FIG. 2, top-view), a periodic two-dimensional array of nanometer-scale features (202), also known as a photonic crystal, is patterned onto the substrate (201), which generates multiple diffraction resonances within the absorber layer of the device. These resonances serve to increase the path length of the wavelengths that are diffracted away from the substrate, increasing the probability of being absorbed. This strategy is particularly useful as the diffraction occurs in a loss-less manner, reducing the losses typically incurred with a purely reflective back-contact. Furthermore, the dimensions and geometry of the photonic crystal can be tuned to accommodate the exact structure of the solar cell device and target particular wavelength ranges for enhanced absorption.

For example, amorphous silicon solar cells typically feature reduced absorption efficiency at wavelengths greater than 650 nm, and by introducing multiple diffraction resonances between 650-800 nm, the absorption can be substantially improved. The exact height, length, width, and geometry (e.g., hexagonal, circular, square) of the features are dependent upon the final solar cell geometry, and the "pitch"

between individual features should typically be similar to or larger than the target wavelengths of light. The height, length, and width will then typically be smaller than the value of the pitch.

Figure 3:
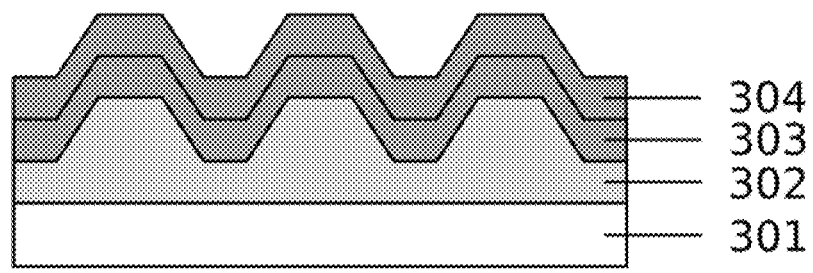
FIG. 3 shows the side-view of the photonic-plasmonic back-reflector structure, according to an exemplary embodiment.

As shown in FIG. 3 (side-view), after patterning of the two-dimensional photonic crystal (302) into or onto the substrate (301), the back-contact metal (303) is deposited, typically consisting of a highly reflective metal such as silver, nickel, gold, copper or aluminum or alloys of same to minimize reflective losses. In addition, it may be desirable to also include a dielectric layer (304), such as ZnO, on top of the metal to further reduce parasitic absorption losses. In the preferred embodiment the dielectric layer is a transparent conductive oxide, such as zinc oxide (ZnO) or aluminum-doped zinc oxide (AZO), this layer can provide an efficient tunnel-diode structure between the metal of the back-reflector and the amorphous silicon layer, enhancing carrier transport through the device. Depending upon the geometry or layout of the solar cell, the plasmonic properties of the metal contact may also be used to further enhance the absorption of light. In the case of a metal such as silver, the localized surface plasmon resonance could lead to light concentration in the vicinity of the back-reflector. In this case, care must also be taken to ensure that the plasmon does not result in absorption losses.

The use of two-dimensional photonic crystals to enhance light absorption in thin-film solar cells has been demonstrated in the literature. In the case of a nano-crystalline silicon solar cell, Dalal et al. ("A photonic-plasmonic structure for enhancing light absorption in thin film solar cells," Appl. Phys. Lett. 99, 131114 (2011)), which is incorporated herein by reference hereto, demonstrated an improvement of >30% in the short-circuit current density ($J_{SC}$), from 16 to 22 mA/cm$^2$, through the use of such a design. More recently, in H-L. Chen, et al., ("A 19.9%-efficient ultrathin solar cell based on a 205-nm-thick GaAs absorber and a silver nanostructured back mirror," Nature Energy, volume 4, pages 761-767 (2019)) which is incorporated herein by reference thereto, a GaAs thin-film solar cell with an absorber layer of 205 nm achieved an efficiency of 19.9% through the use of a nanostructured (i.e., photonic crystal) back-reflector.

Thin-Film Crystalline Silicon Heterojunction Solar Cell Using an all-PECVD Deposition Process The above-described laser annealing and photonic-plasmonic back reflector lead to a third aspect of the present disclosure: a thin-film solar cell with a crystalline silicon absorber with thickness of approximately 1-20 µm. The integration of these elements is unique and advantageous because all deposition steps for the solar cell can be performed at low temperature, approximately <450° C. or less, using commercial high-throughput equipment, such as PECVD. Compared to conventional amorphous silicon solar cells, the solar cells according to the present disclosure include a crystalline absorber instead of an amorphous absorber layer. Further, as compared to conventional monocrystalline HIT solar cells (such as those available from Panasonic), the absorber in the presently disclosed configuration is 1-20 µm instead of 100 µm or greater for the HIT cell, which provides a light weight, flexible solar cell with high efficiency.

For low-cost, high-volume manufacturing it is highly desirable to maintain a deposition temperature as low as possible. While this can be difficult for silicon, since higher temperatures typically provide higher crystal quality, techniques such as PECVD have enabled low-temperature deposition with high quality materials. This allows the use of lower temperature inexpensive support substrates such as polyimides, so that the solar cell is able to be deposited on a thin flexible film. At the same time, however, as discussed in the section on laser annealing, the crystal quality of the seed layer will largely be replicated in the absorber layer. Some improvement in the material quality of the absorber layer can be expected, though the improvement will largely be in relation to the crystalline quality of the seed layer. For example, the grain sizes for the crystals in the absorber will initially be quite similar to that in the seed layer. As an example, in work done by Dalal et al. at Iowa State University, epitaxial crystalline silicon was deposited by ECR-CVD onto a mono-crystalline silicon substrate, with the electrical properties of the epitaxial material closely replicating that of the substrate. In particular, the carrier mobility values in the epitaxial material were similar to what would be expected for mono-crystalline bulk silicon of similar doping concentration.

In the embodiment described herein, the crystalline absorber layer is deposited by PECVD, though other techniques may also be used. Work by Dalal et al. has also used a technique similar to PECVD, referred to as electron cyclotron resonance chemical vapor deposition (ECR-CVD). In addition, other embodiments could include depositing amorphous materials using electron-beam evaporation, low-pressure chemical vapor deposition (LP-CVD), or PECVD, followed by laser annealing and crystallization of those layers.

The layer structure for the solar cell device is provided in FIG. 4. Because of the flexible nature of the disclosed solar cell device, the substrate (401) onto which all layers are deposited should also be flexible, and may be any material capable of withstanding the processing temperatures, including but not limited to: metals or metal alloys of molybdenum, stainless steel, or aluminum, polymeric materials such as polyimide, or other materials such as flexible glass (e.g., Willow® glass by Corning Incorporated, Corning, N.Y.). Onto or into the substrate, the photonic-plasmonic back-reflector is fabricated using nano-imprint lithography to define the geometry of the photonic crystal (402). Other high-resolution patterning techniques such as hot-embossing may also be used, provided they are able to deliver the proper resolution in a high-volume processing platform. The geometry of the photonic crystal typically takes the form of a periodic structure with features having dimensions smaller than the wavelengths of light to be absorbed, typically in the range of 400-1100 nm. For example, in previous work by Dalal et al., a periodic array of pillars with pitch of 750 nm and height of 160 nm was used, whereas the pillars themselves had dimensions of ~0.400-500 nm.

On top of the periodic structure is disposed a high-reflectivity metal (403) such as silver, nickel, gold, copper or aluminum or alloys thereof. In some embodiments, this metal layer also possesses strong plasmonic properties which further enhances the light-trapping properties of the photonic crystal back-reflector. Thicknesses of the metal layer are typically in the range of 50-200 nm, but may be thicker or thinner as needed to optimize the light-trapping properties of the photonic crystal back-reflector.

In some embodiments, a conductive, transparent dielectric layer (404) such as zinc oxide (ZnO), aluminum-doped zinc oxide (AZO) or SiO$_2$ may also be disposed on top of the metal layer (403) to increase reflectivity and enhance carrier transport. A highly conducting dielectric layer not only increases reflectivity of the back-reflector, but also helps to create a tunnel diode between the metal layer and the first amorphous silicon layer, thereby enhancing carrier transport. Thicknesses of the conductive, transparent dielectric layer are typically in the range of 50-200 nm, but may be thicker or thinner as needed to optimize the light-trapping properties of the photonic crystal back-reflector.

For the active device layers of the solar cell, a first amorphous silicon layer (405) is deposited with a thickness approximately of 0.1-2.0 μm. Depending upon the specific processing and device layout details, however, this layer could be thicker or thinner. Because this layer is in contact with the back-reflector structure, it is advantageous for this first amorphous silicon layer to be doped, preferably with a high dopant concentration on the order of $1\times10^{18}$ cm$^{-3}$ or greater to reduce contact resistance. For this first amorphous silicon layer, the dopant can be either a donor (n-type) or acceptor (p-type). One of the primary considerations for the thickness of this layer is to provide adequate separation from the high temperature of the laser crystallized silicon, with a highly localized temperature that can exceed 1300° C. to melt the silicon material. In addition, some amount of amorphous silicon material will be consumed, via conversion to crystalline silicon. To maintain the heterostructure nature of the design, some amorphous silicon material must remain after the crystallization. On the other hand, the layer should be as thin as possible to minimize parasitic absorption.

After the amorphous silicon layer is deposited, a thin top-layer of this material is crystallized (406) and serves as a seed-layer for the absorber layer deposition. The thickness of this laser crystallized silicon is about 50-200 nm, although a thicker or thinner layer may also be advantageous. Typically, thicker layers allow for larger grain sizes, and the ultimate thickness of this laser crystallized layer will likely be dictated by the grain sizes necessary for a high efficiency device. Grain sizes as large as possible are desired, as they typically result in lower defect density and higher solar cell efficiency; grain sizes greater than 1 μm are preferable, with grain sizes greater than 5 μm more preferable, and grain sizes greater than 10 μm still more preferable. In addition, the hydrogen content of the region that is to be melted and crystallized using the laser annealing process must be substantially lower than that for typical amorphous silicon. The reason being that hydrogen can preferentially rapidly leave the crystal lattice and fracture or de-laminate the device layers from the substrate. A hydrogen concentration of less than 5% is preferably to avoid damage to the device layers, and more preferably as low as 1% or less.

With the crystalline seed layer in place, a relatively low temperature PECVD process of 350-550° C. is then used to deposit approximately 1-2 μm of undoped crystalline silicon (407), or in some embodiments up to 5 μm, up to 10 μm, or up to 20 μm of undoped silicon. Furthermore, in some embodiments it may be desirable to introduce donor or acceptor dopants to enhance the conductivity or electric field profile within the device. Typically, the dopant is introduced at a low concentration of less than $1\times10^{18}$ cm$^{-3}$, and often less than $1\times10^{17}$ cm$^{-3}$, and can be either of the donor type (n-type) or acceptor type (p-type). As mentioned previously, the grain sizes for the crystalline silicon should be as large as possible to minimize recombination and carrier scattering associated with crystal grain boundaries. Grain sizes larger than 10 μm are preferred, and grain sizes of 100 μm or greater may be achievable depending on various laser annealing methods.

Because of the poly-crystalline nature of the silicon in the absorber layer, a large defect density associated with dangling bonds at the surfaces and boundaries of the individual grains may result. These defects lead to increased recombination of the photo-generated carriers within the absorber, resulting in a reduction in the solar cell efficiency. In order to reduce the defect density and improve efficiency, it is possible to utilize hydrogen passivation of the dangling bonds, which can be incorporated into the solar cell fabrication process via several methods. One such method represents an in-situ approach, where the hydrogen content within the deposition chamber is adjusted during the deposition of the crystalline silicon absorber layer to incorporate hydrogen on the surface of the grains. This has the advantage of not requiring a separate process step after deposition of the crystalline silicon absorber layer. An additional method of hydrogen passivation is to use a separate process, after the deposition of the crystalline silicon absorber layer is complete, such as thermal annealing or a plasma-based process to generate hydrogen species capable of passivation silicon dangling bonds. The advantage of using a separate process step for the hydrogen passivation is that the process conditions can be tuned independently of those used for the crystalline silicon deposition process. In other words, the range of process parameters allowed by the deposition process may not be sufficiently large to optimize the hydrogen passivation process. In this case, a separate hydrogen passivation step would be preferred.

After deposition of the crystalline absorber layer, a second layer of amorphous silicon (408) is deposited to form a carrier selective heterojunction with the absorber layer, similar to that formed between first amorphous silicon layer and the absorber layer. Because of the larger bandgap for amorphous silicon (1.6-1.9 eV) compared with crystalline silicon (1.1 eV), it is possible to engineer energy barriers into the device structure that prevent recombination at the contacts and also in the quasi-neutral regions of the device, which help to ensure high efficiency for thin-film solar cells. In addition, to minimize parasitic absorption, the p-type layer of amorphous silicon is typically an alloy of silicon carbide, which has a larger bandgap compared to amorphous silicon. The larger bandgap results in a lower absorption coefficient and substantially reduced parasitic absorption losses. The thickness of this layer is typically quite thin, 50 nm or less, and more preferably 20 nm or less.

Once all the amorphous and crystalline silicon layers are deposited, a top-side transparent conductive electrode is deposited. In this case, the electrode can be any transparent conductive oxide (TCO) such as indium tin oxide (ITO), zinc oxide (ZnO), aluminum zinc oxide (AZO), or one of several other materials typically used in solar cells. The TCO is typically between 100 nm to 300 nm in thickness.

In addition to the single-junction design described herein, other embodiments may include multi-junction designs as well. For example, a second cell having an absorber layer with a larger bandgap may be deposited on top of the cell described in FIG. 5, creating a tandem cell and improving the efficiency beyond the 17-20% anticipated for the single-junction design. In principle, other embodiments with three or more junctions are also possible, using crystalline silicon, amorphous silicon, and alloys of crystalline and amorphous using silicon, germanium, and carbon. For such a design, additional solar cells with bandgap energies larger than that of the bottom cell would be incorporated, with the bottom cell retaining a design similar to that of the invention described herein. In embodiments, to optimize the efficiency of a multiple-junction cell, the bandgap energy of the bottom cell is modified via alloying with an element (such as Ge). Overall, the design is similar to that in FIG. 4, having a substrate (501), a photonic-plasmonic back-reflector (502), with a back-contact metal (503), a conductive and transparent dielectric layer (504), a first amorphous silicon layer (505), a thin layer of amorphous silicon that has been crystallized using laser annealing (506), a thin-film crystalline silicon absorber layer, (507), and a second layer of amorphous silicon (508). To incorporate additional solar cells on top of this cell, a tunnel-diode layer (509) is then deposited on top of the bottom cell, which physically separates it from the second cell (510), thereby creating a multiple-junction solar cell. For additional solar cells, an additional tunnel-diode layer (511) can be introduced followed by the solar cell itself (512). The process in principle can be repeated as necessary to incorporate as many cells as desired, and once all cells have been incorporated, a final transparent contact layer is deposited (513).

REFERENCES

Publications: Laser Annealing

E. A. Al Nuaimy, et al., "Excimer laser crystallization and doping of source and drain regions in high quality amorphous silicon thin film transistors," Appl. Phys. Lett. 69, 3857 (1996) DOI:10.1063/1.117128.

J. Dore, et al., "Performance potential of low-defect density silicon thin-film solar cells obtained by electron beam evaporation and laser crystallization," EPJ Photovoltaics 4, 40301 (2013) DOI: 10.1051/epjpv/2012012.

G. Andra, et al., "A new technology for crystalline silicon thin film solar cells on glass based on laser crystallization," Proceedings of IEEE Photovoltaic Specialists Conference—2000, DOI: 10.1109/PVSC.2000.915794

Publications—Silicon Heterojunction Solar Cell

C. Balliff, et al., "Amorphous Silicon/Crystalline Silicon Heterojunction Solar Cells," Semiconductors and Semimetals, 90, 73-120 (2014) DOI: 10.1016/B978-0-12-388417-6.00003-9.

S. de Wolf, et al., "High-efficiency Silicon Heterojunction Solar Cells: A Review," Green, vol. 2: issue 1 (2012) DOI: 10.1515/green-2011-0018.

M. Taguchi et al., "24.7% Record Efficiency HIT Solar Cell on Thin Silicon Wafer," in *IEEE Journal of Photovoltaics*, vol. 4, no. 1, pp. 96-99, January 2014, DOI: 10.1109/JPHOTOV.2013.2282737.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A solar cell device comprising:
   a photonic-plasmonic back-reflector comprising a photonic crystal and a reflective and plasmonic metal contact disposed on the photonic crystal;
   a first layer of amorphous silicon disposed on the metal contact of the back reflector;
   a seed layer crystallized from a portion of a thickness of the first layer of amorphous silicon using a laser annealing process;
   a crystalline silicon absorber layer disposed on the laser annealed seed-layer, the crystalline silicon absorber layer comprising a thickness of 20 μm or less; and
   a second layer of amorphous silicon disposed on the crystalline silicon absorber layer.

2. The solar cell device of claim 1, wherein the photonic-plasmonic back-reflector includes a transparent conductive oxide layer that is disposed on top of the metal contact to form a tunnel-diode to the first layer of amorphous silicon.

3. The solar cell device of claim 2, wherein the transparent conductive oxide layer comprises at least one of aluminum-doped zinc oxide, silicon dioxide, or zinc oxide.

4. The solar cell device of claim 1, wherein the first layer of amorphous silicon is n-type doped.

5. The solar cell device of claim 1, wherein the first layer of amorphous silicon is n-type doped at a concentration of at least $1 \times 10^{18}$ cm$^{-3}$.

6. The solar cell device of claim 1, wherein the first layer of amorphous silicon is p-type doped.

7. The solar cell device of claim 1, wherein the first layer of amorphous silicon is p-type doped at a concentration of at least $1 \times 10^{18}$ cm$^{-3}$.

8. The solar cell device of claim 1, wherein the crystalline silicon absorber layer is deposited using PECVD at a deposition temperature of 550° C. or less.

9. The solar cell device of claim 1, wherein the first layer of amorphous silicon is hydrogenated at a concentration of 10 at % or less.

10. The solar cell device of claim 1, wherein the first layer of amorphous silicon is hydrogenated at a concentration of 5 at % or less.

11. The solar cell device of claim 1, wherein the crystalline silicon absorber layer comprises a thickness of 10 μm or less.

12. The solar cell device of claim 1, wherein the crystalline silicon absorber layer comprises a thickness of 5 μm or less.

13. The solar cell device of claim 1, wherein the crystalline silicon absorber layer comprises a thickness of 2 μm or less.

14. The solar cell device of claim 1, wherein the seed layer after laser annealing contains crystalline grains of at least 1 μm.

15. The solar cell device of claim 1, wherein the solar cell device is configured as a multi-junction device with one or more additional junctions disposed in a series configuration.

16. The solar cell device of claim 1, wherein at least one of the first layer of amorphous silicon, the seed layer, the crystalline silicon absorber layer, or the second layer of amorphous silicon is alloyed with an additional element to increase or decrease a bandgap of the first layer of amorphous silicon, the seed layer, the crystalline silicon absorber layer, or the second layer of amorphous silicon.

17. The solar cell device of claim 16, wherein the additional element comprises at least one of germanium or carbon.

18. The solar cell device of claim 1, where the first or second layers of amorphous silicon within the solar cell device are alloyed with an additional element to increase or decrease a bandgap of the first or second layers of amorphous silicon and create a heterojunction with the crystalline silicon absorber layer.

19. The solar cell device of claim 18, wherein the additional element comprises at least one of germanium or carbon.

20. The solar cell device of claim 1, where the crystalline silicon absorber layer is undoped, n-type doped, or p-type doped.

21. The solar cell device of claim 1, where the crystalline silicon absorber layer undergoes hydrogen passivation during or after deposition to reduce defects associated with grain boundaries.

* * * * *